(12) United States Patent
Jacquinot et al.

(10) Patent No.: US 7,077,727 B2
(45) Date of Patent: Jul. 18, 2006

(54) PROCESS FOR CHEMICAL-MECHANICAL POLISHING OF METAL SUBSTRATES

(75) Inventors: Eric Jacquinot, Trosly Breuil (FR); Didier Bouvet, Morges (CH); Patrice Beaud, Lausanne (CH)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/500,986

(22) PCT Filed: Feb. 12, 2003

(86) PCT No.: PCT/IB03/00535

§ 371 (c)(1),
(2), (4) Date: Jul. 6, 2004

(87) PCT Pub. No.: WO03/068881

PCT Pub. Date: Aug. 21, 2003

(65) Prior Publication Data

US 2005/0085166 A1    Apr. 21, 2005

(30) Foreign Application Priority Data

Feb. 13, 2002 (FR) ................................. 02 01790

(51) Int. Cl.
*B24B 1/00* (2006.01)

(52) U.S. Cl. .................. 451/41; 451/36; 451/287; 438/692; 438/693; 156/345.11; 156/345.12

(58) Field of Classification Search .............. 451/41, 451/36, 285, 287; 438/692, 693; 156/345.11, 156/345.12; 51/308, 309
See application file for complete search history.

(56) References Cited

U.S. PATENT DOCUMENTS

| | | | | |
|---|---|---|---|---|
| 5,858,813 A * | 1/1999 | Scherber et al. | ........... | 438/693 |
| 6,043,159 A * | 3/2000 | Jacquinot et al. | ........... | 438/693 |
| 6,267,909 B1 * | 7/2001 | Currie et al. | ........... | 252/79.1 |
| 6,375,552 B1 * | 4/2002 | Cadien et al. | ........... | 451/41 |
| 6,479,374 B1 * | 11/2002 | Ioka et al. | ........... | 438/601 |
| 6,692,546 B1 * | 2/2004 | Ma et al. | ........... | 51/298 |

\* cited by examiner

*Primary Examiner*—Eileen P. Morgan
(74) *Attorney, Agent, or Firm*—Alan P. Kass

(57) ABSTRACT

Abrasive composition for the chemical-mechanical polishing in one stage of substrates used in the microelectronics semiconductors industry containing at least one metal layer and one insulator layer, comprising an acid aqueous suspension of individualized particles of colloidal silica, not linked to each other by siloxane bonds, having a mean particle diameter of between 5 and 20 nm and an oxidizing agent, and chemical-mechanical polishing process using such a composition.

22 Claims, 3 Drawing Sheets

PROCESS FOR CHEMICAL-MECHANICAL POLISHING OF METAL SUBSTRATES

This application is a United States National Stage Patent Application under 35 U.S.C. §371 of International Patent Application No. PCT/IB03/00535, filed Feb. 12, 2003, which claims priority to French Patent Application No. 0201790, filed Feb. 13, 2002, the contents of which are hereby incorporated herein by reference.

The present invention relates to a chemical-mechanical polishing process and to an abrasive composition used in the polishing and flattening of surfaces in the micro-electronics semiconductors industry, and more particularly of substrates comprising at least one metal layer and one insulator layer.

Integrated circuits are constituted by a large number of active devices (transistors for example).

These active devices, isolated from each other, must be interconnected by means of interconnections and vias at multiple levels.

Different metals are used to produce these interconnections and it is often necessary to polish these metal layers during the manufacturing process.

Chemical-mechanical polishing (CMP) is a technology greatly used in the micro-electronics semiconductors industry for polishing different layers of materials found on or in semiconductor substrates.

The production of interconnections or of vias is carried out as follows:
- an insulator layer is deposited on a support,
- trenches or holes are produced in the insulator,
- in general, a barrier layer is then deposited on the free upper surface of the insulator, which thus covers the insulator and the bottom and sides of the trenches,
- the same procedure is then carried out with a metal layer,
- an abrasion is then carried out in order to eliminate from the upper surface of the insulator the metal and, if necessary, the product forming a barrier.

A flat surface is obtained because the trenches have been filled.

These operations can be repeated in order to obtain several successive strata of metal and of insulator (see FIGS. 3 and 4).

For the chemical-mechanical polishing of substrates containing at least one metal layer and one insulator layer, two phenomena must be avoided:
- an attack of the subjacent insulator layer, also called erosion. This locally introduces ridges and acts contrary to the sought objective of flattening.
- an over-polishing of the metal layer, also called "dishing" which will also generate ridges.

It is therefore desirable to find abrasive compositions making it possible to obtain a high polishing speed of the metal layer, an excellent surface state of the metal layer and of the insulator layer, a uniformity of polishing of the metal layer and good selectivity between the polishing of the metal and that of the insulator.

Furthermore, the composition must be as simple as possible, that is to say it must contain a minimum number of constituents.

The abrasive compositions known at present for polishing substrates containing at least one metal layer and one insulator layer essentially contain an abrasive, an oxidizing agent and one or more additives making it possible to modify the selectivity of polishing the layers (see Advanced Silicon Processing—2002, Chapter 5, page 57, Lattice Press).

U.S. Pat. No. 5,916,855, U.S. Pat. No. 6,117,783 and U.S. Pat. No. 5,244,534 describe the use of polishing slurries containing aluminium oxide particles. These polishing compositions have good polishing speeds of the metal layer as well as a good selectivity with respect to the insulator layer. However, these aluminium oxide particles are not very stable over time and have a tendency to form agglomerates causing micro-scratches on the surface of the polished layers.

It is therefore necessary to have recourse to a second finishing polishing stage in order to eliminate these scratches (see Advanced Silicon Processing—2002, Chapter 5, Page 58, Lattice Press).

Colloidal particles of pyrogenated silica (or fumed silica) are also used as in EP-A-708160, EP-A-844290 or EP-A-896042.

The use of these particles has a certain number of drawbacks. Firstly, because of the wide distribution of the length of the aggregates, there is a tendency toward the sedimentation of the latter over the course of time and therefore a lack of stability. Furthermore, this low stability can be minimized only by a constant agitation of the suspension, which does not facilitate the utilization.

More recently, the use of colloidal silica for the polishing of metals is described for example in the patent WO 00/30154. However, a poor metal/insulator polishing selectivity is observed.

Now, the applicant has observed surprisingly and unexpectedly that the use of small-sized individualized particles of colloidal silica, not linked to each other by siloxane bonds, in acid aqueous suspension, and in the presence of an oxidizing agent, even in the absence of polishing additives such as an anti-corrosion agent or a cleaning agent, made it possible to obtain directly a high polishing speed of the metal layer, an excellent surface state of the metal layer and of the insulator layer, a uniformity of polishing of the metal layer and good selectivity between the polishing of the metal and of the insulator without having to carry out a second supplementary stage of finishing polishing (referred to in English as "post metal polishing" or buff polishing").

That is why the present application relates to a chemical-mechanical polishing process (also called CMP) for substrates used in the microelectronics semiconductors industry and containing at least one metal layer and one insulator layer, separated, if necessary, by a barrier layer, in which the metal layer or layers and the barrier layer or layers are subjected to friction using a polishing pad by moving the substrate with respect to the pad and by pressing the substrate against the said pad, and an abrasive composition is deposited on the pad during the polishing, characterized in that the said process is carried out in a single stage, in that the abrasive composition comprises:
- an acid aqueous suspension of individualized particles of colloidal silica, not linked to each other by siloxane bonds, having a mean particle diameter of between 5 and 20 nm,
- an oxidizing agent, and in that the metal layer and, if applicable, the barrier layer, is or are eliminated from the surface of the insulator in order to obtain a metal and insulator surface not requiring any finishing polishing.

With regard to substrates, it is possible to mention in particular, according to the present invention, substrates in which the metal layer is produced from a metal selected from the group comprising aluminium, copper and tungsten, and preferably the latter, and the barrier layer is produced from a material selected from the group including titanium, tantalum, titanium nitride, tantalum nitride and any combination or alloy of at least two of them.

The insulation layer is in particular selected from the group comprising silicon oxide, tetraethoxysilane oxide, phosphosilicate glass, borophosphosilicate glass and polymers with a low dielectric constant, and more particularly from the group comprising silicon oxide, tetraethoxysilane oxide, phosphosilicate glass and borophosphosilicate glass.

The abrasive composition can be poured on the polishing pad continuously or sequentially, regularly or irregularly. The composition is thus dragged to the interface between the polishing pad and the substrate and can thus polish the surface of the latter.

The polishing pad is normally made from organic polymer of the polyurethane type.

During its use, the above acid aqueous suspension of colloidal silica is used with a concentration by weight of silica of between 0.1 and 15%, in particular of between 1 and 10%, and especially between 2 and 5%.

The acid aqueous suspension of individualized particles of colloidal silica, not linked to each other by siloxane bonds, is preferably used at a pH of less than 5, in particular of between 1 and 5, and especially of between 1.5 and 3.

The acidification can be obtained in particular by the addition of a mineral acid such as nitric acid or phosphoric acid.

The mean diameter of the individualized particles of colloidal silica, not linked to each other by siloxane bonds, is advantageously between 7 and 15 nm and especially between 9 and 12 nm.

The particles of colloidal silica which can be used in the present invention can be obtained by using wet processes starting with raw materials such as tetramethyl- or tetraethyl-orthosilicate, or even sodium or potassium silicate.

These processes known to those skilled in the art are described in "K. K. Iler, The Chemistry of Silica, Chapter 9, Pages 331 to 343, Published by Wiley Interscience, 1979".

Aqueous suspensions of individualized particles of colloidal silica, not linked to each other by siloxane bonds and stable in time, are directly obtained by these processes.

It is necessary here to recall the fundamental differences existing between individualized particles of colloidal silica, not linked to each other by siloxane bonds, and other types of silica such as pyrogenated silicas, also called fumed silica.

These particles of pyrogenated silica can be obtained by using dry processes. They are prepared for example by combustion of tetrachlorosilane of high purity with hydrogen and oxygen in a combustion chamber at high temperature. The particles are not individualized but exist in the form of aggregates or agglomerates of primary particles of spherical silica of 5 to 50 nm which form aggregates of particles of length generally within the range 50 to 500 nm. The particles obtained in powder form must be dispersed in the polishing medium (water for example).

The structure of the different silicas is illustrated hereafter in the FIGS. 1 and 2.

Furthermore, hydrogen peroxide is mentioned regularly as an oxidizing agent for the metals in the polishing slurries.

However, there are several drawbacks in the use of hydrogen peroxide. It decomposes over time, which leads to a reduction in the activity of the abrasive composition. Consequently, for transport and storage, a specific package for the abrasive composition and a specific package for the hydrogen peroxide are required and the hydrogen peroxide is added to the abrasive composition at the last moment before use.

Under preferred conditions of implementing the process described above, the oxidizing agent is an iodate, in particular potassium or sodium iodate.

The oxidizing agent is for example used at a concentration by weight of between 0.1 and 15% in the composition ready for use, in particular of between 0.1 and 6%, and advantageously of between 2 and 5%.

The abrasive compositions to which the present invention relates have very useful properties.

They make it possible to obtain a high polishing speed of the metal layer.

They also make it possible to obtain an excellent surface state of the metal layer and of the insulator layer.

The polishing of the metal layer is uniform.

It should also be noted that there is a good selectivity between the polishing of the metal and that of the insulator.

They can be ready for use, depending on the oxidizing agent used.

That is why the present application also relates to an abrasive composition for chemical-mechanical polishing, characterized in that the said abrasive composition comprises or preferably consists of:
  an acid aqueous suspension of individualized particles of colloidal silica, not linked to each other by siloxane bonds, having a mean particle diameter of between 5 and 20 nm,
  an oxidizing agent.

The present application also relates to the above ready-for-use abrasive composition, not requiring the addition of the oxidizing agent at the moment of use, characterized in that the oxidizing agent is an iodate, in particular potassium iodate or sodium iodate.

The abrasive compositions of the present invention can optionally contain additives such as surface-active agents, complexing agents, corrosion inhibitors, additives that modify the polishing selectivity, buffering agents, stabilizers, bactericides, fungicides and biocides.

However, under other preferred conditions of the invention, the abrasive composition used comprises at most two polishing additives, such as anti-corrosion agents or cleaning agents, preferably one additive at most, and in particular substantially comprising no additive, that is to say less than 0.08% by weight, in particular less than 0.05% by weight and especially no additive at all.

In particular, an abrasive composition according to the invention contains:
  substantially no anti-corrosion agent,
  substantially no cleaning agent,
  substantially no anti-corrosion agent and no cleaning agent.

The preferred conditions of implementing the processes described above also apply to the other objects to which the invention relates, as mentioned above, in particular to abrasive compositions.

The structure of colloidal silica whose particles are individualized and not linked to each other by siloxane bonds is illustrated in FIG. 1 by a photograph taken with an electronic microscope.

The structure of fumed silica is illustrated in FIG. 2 by a photograph taken with an electronic microscope.

Figure 1:
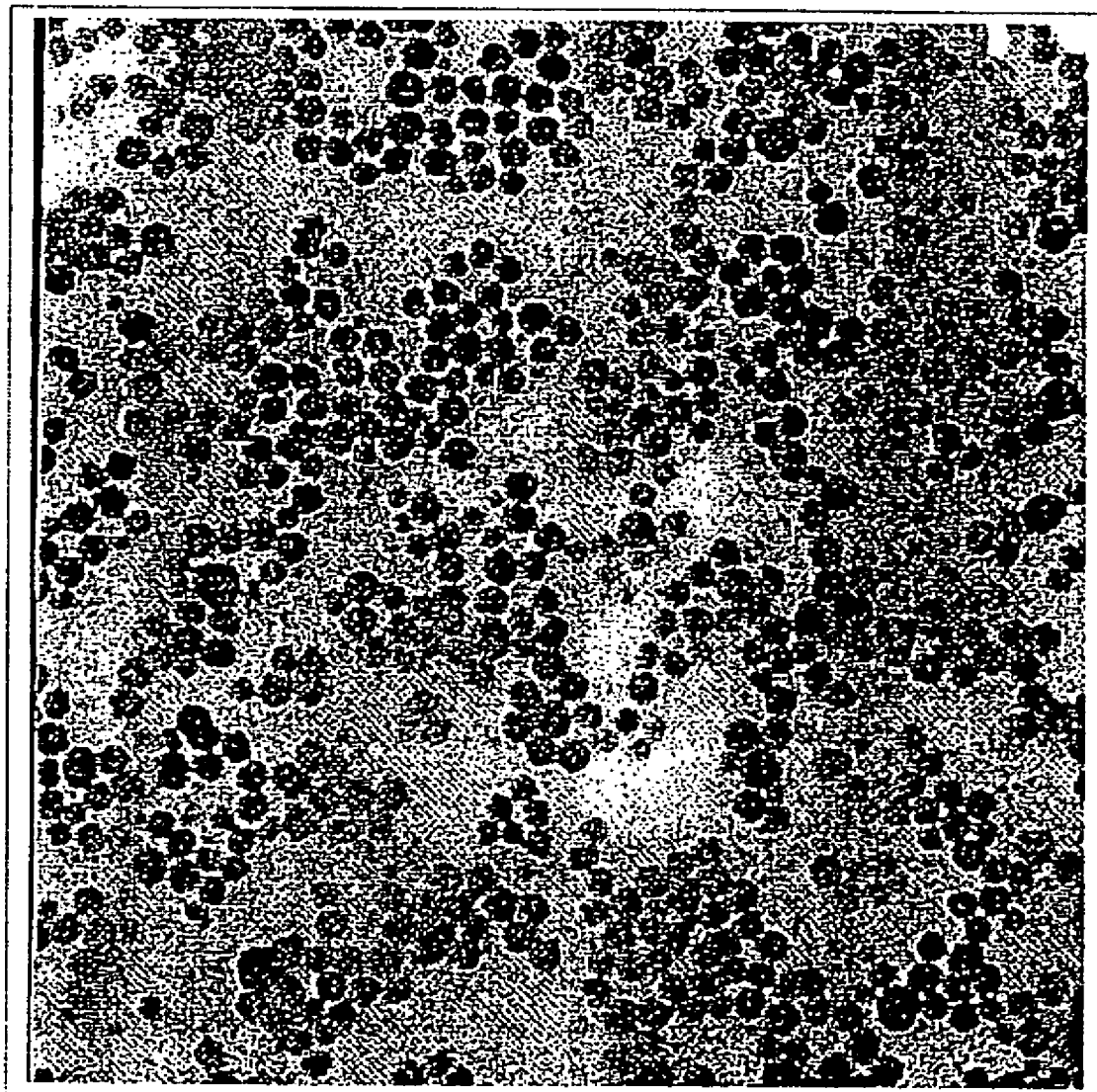
Figure 2:
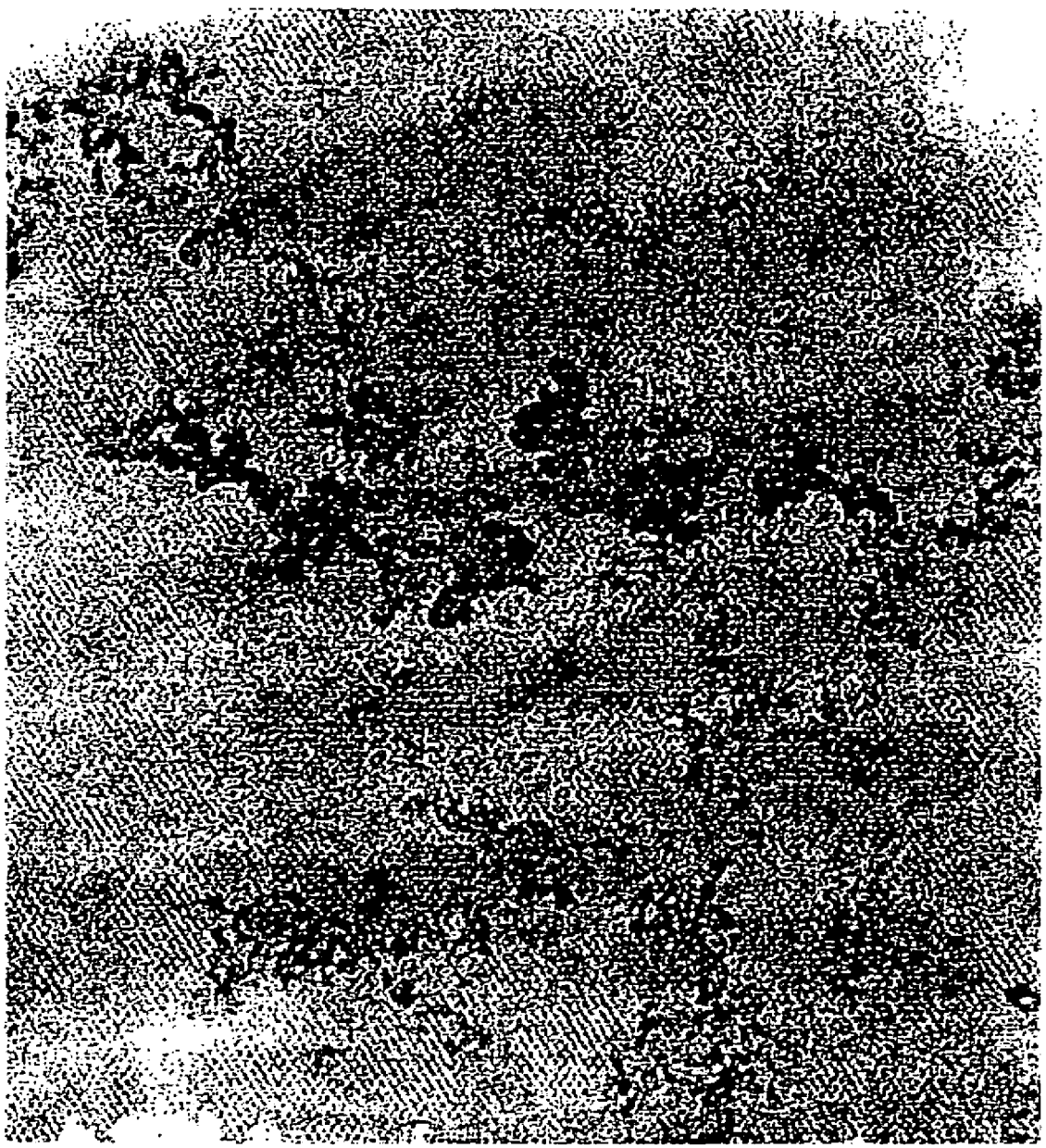
Figure 3:
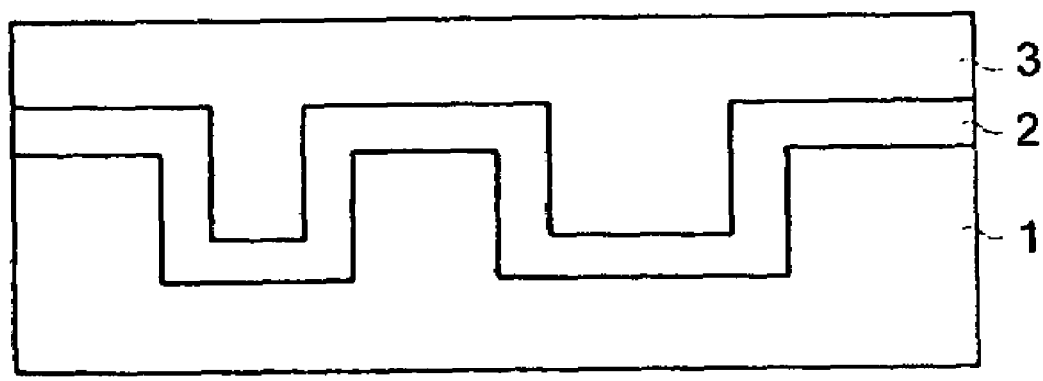
FIG. 3 shows a stratum of layers deposited on a support.
Figure 4:
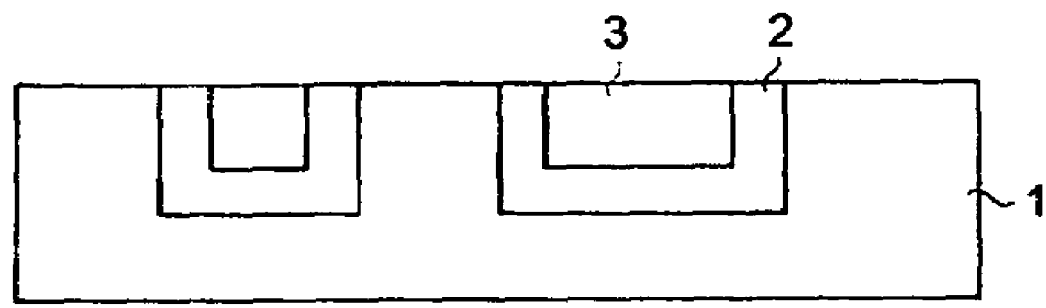
FIG. 4 shows the stratum of FIG. 3 after chemical-mechanical polishing according to the invention.

The support layer is not shown. Layer 1 is the insulator layer, layer 2 is a barrier and layer 3 is a metal.

The following examples illustrate the present application. "%" always means "% by weight".

EXAMPLE 1

To 8,370 g of an acid aqueous suspension of colloidal silica having a concentration by weight of silica of 20%, a mean particle diameter of 12 nm and a pH of 2.4 (marketed under the name KIebosol® PL 152H-12), is added 53,630 g of an 4.5% aqueous solution of $KlO_3$. 62,000 g of an acid polishing composition are obtained containing 2.7% of colloidal silica having a mean particle diameter of 12 nm and 3.9% of $KlO_3$ as an oxidizing agent. The pH of the abrasive composition is adjusted to 2.1 by adding 65% nitric acid.

EXAMPLE 2

An acid polishing composition is prepared containing 2.7% of colloidal silica having a mean particle diameter of 7 nm, a pH of 2.1 and 3.9% of $KlO_3$ as an oxidizing agent by proceeding as in example 1 but using an acid aqueous suspension of colloidal silica having a mean particle diameter of 7 nm.

EXAMPLE 3

An acid polishing composition is prepared containing 2.7% of colloidal silica having a mean particle diameter of 9 nm, a pH of 2.1 and 3.9% of $KlO_3$ as an oxidizing agent by proceeding as in example 1 but using an acid aqueous suspension of colloidal silica having a mean particle diameter of 9 nm.

EXAMPLE 4

To 8,370 g of an acid aqueous suspension of colloidal silica having a concentration of silica of 20%, a mean particle diameter of 12 nm and a pH of 2.4 (marketed under the name Klébosol® PL 152H-12), is added 16,533 g of a 30% aqueous solution of $H_2O_2$ and then a sufficient quantity of water to reach 62,000 g is added. 62,000 g of an acid polishing composition are obtained containing 2.7% of colloidal silica having a mean particle diameter of 12 nm and 8% of $H_2O_2$ as an oxidizing agent. The pH of the abrasive composition is adjusted to 2.1 by adding 65% nitric acid.

COMPARATIVE EXAMPLE C1

To 5,580 g of an acid aqueous suspension of colloidal silica having a concentration of silica of 30%, a mean particle diameter of 25 nm (marketed under the name Klébosol® PL 150H-25), are added 56,420 g of a 4.3% aqueous solution of $KlO_3$ 3%. 62,000 g of an acid polishing composition containing 2.7% of colloidal silica having a mean particle diameter of 25 nm and 3.9% of $KlO_3$ as an oxidizing agent are obtained. The pH of the abrasive composition is adjusted to 2.1 by adding 65% nitric acid.

COMPARATIVE EXAMPLE C2

An acid polishing composition is prepared containing 2.7% of colloidal silica having a mean particle diameter of 50 nm, a pH of 2.1 and 3.9% of $KlO_3$ as an oxidizing agent by proceeding as in comparative example C1 but using an acid aqueous suspension of colloidal silica having a mean particle diameter of 50 nm (marketed under the name Klébosol® PL 150H-50).

COMPARATIVE EXAMPLE C3

To 46,500 g of an acid aqueous suspension of colloidal silica having a concentration of silica of 20%, a mean particle diameter of 12 nm and a pH of 2.4 (marketed under the name Klébosol® PL 152H-12), are added 13,082 g of water and then 2,418 g of $KlO_3$ are dissolved whilst stirring. 62,000 g of an acid polishing composition containing 15% of colloidal silica having a mean particle diameter of 12 nm and 3.9% of $KlO_3$ as an oxidizing agent are obtained. The pH of the abrasive composition is adjusted to 2.1 by adding 65% nitric acid.

EXAMPLES OF APPLICATION

For polishing the insulator, silicon substrates are used upon which is deposited by plasma a layer of tetraethoxysilane oxide (TEOS) of about 3200 Å. For polishing the tungsten, silicon substrates are used upon which is deposited a layer of TEOS (about 6000 Å) and then a layer of titanium (about 300 Å), then a layer of titanium nitride (about 1000 Å) and finally a layer of tungsten (about 8000 Å). The layer of TEOS and of tungsten is then polished on a Mecapol® E460 polishing machine under the following conditions:

| | |
|---|---|
| Down force: | 0.48 bar |
| Plate speed: | 70 rpm |
| Head speed: | 50 rpm |
| Abrasive flow rate: | 150 ml/min |
| Polishing pad: | IC 1000 K with Rodel furrows. |

The test of the speed of attack of the TEOS and tungsten layer is then carried out. The speed of attack is measured by the difference in thickness before and after polishing per minute of polishing. It is expressed in A/min. In order to measure the thickness of the TEOS, a NANOSPEC AFT-6100 spectro-reflectometer is used with measurement at 49 points. In order to measure the thickness of the tungsten, an RS75 KLA-Tencor OmniMap® 4-probe resistivimeter is used with measurement at 49 points.

EXPERIMENT 1

Effect of Particles Size

A layer of tungsten and TEOS is polished under the conditions mentioned above using abrasive compositions comprising an acid aqueous suspension of individualized colloidal silica particles, not linked to each other by siloxane bonds. The abrasive compositions contain 2.7% of colloidal silica, have a pH of 2.1 and contain 3.9% of $KlO_3$. The results obtained are shown in Table 1.

TABLE 1

| Tests | Mean diameter of the abrasive particles (nm) | Tungsten polishing speed (Å/min) | TEOS polishing speed (Å/min) | Tungsten/ TEOS Selectivity |
|---|---|---|---|---|
| 1 | 7 | 2400 | 90 | 26/1 |
| 2 | 9 | 2800 | 110 | 25/1 |
| 3 | 12 | 3300 | 250 | 13/1 |
| 4 | 25 | 2000 | 1000 | 2/1 |
| 5 | 50 | 1000 | 1700 | 0.6/1 |

The different tests in Table 1 show the effect of abrasive particles size on the polishing speed of the metal layer and of the insulator layer and the metal to insulator polishing selectivity. The following can be observed, for the small particles sizes (7, 9 and 12 nm):

a good polishing speed of the tungsten layer
a low polishing speed of the TEOS which reveals a good tungsten/TEOS polishing selectivity. On the contrary, the following can be observed for the larger particles sizes:

a significant reduction in the tungsten polishing speed
an increased TEOS polishing speed which reveals a very poor tungsten/TEOS polishing selectivity.

EXPERIMENT 2

Effect of the pH Value

Under the same conditions as before, a layer of TEOS and tungsten was polished using abrasive compositions comprising an aqueous suspension of individualized colloidal silica particles, not linked to each other by siloxane bonds. The abrasive compositions contain 2.7% of colloidal silica, with a mean particle diameter of 9 nm and contain 3.9% of $KIO_3$. The results obtained are shown in Table 2.

TABLE 2

| Tests | pH | Tungsten polishing speed (Å/min) | TEOS polishing speed (Å/min) | Tungsten/TEOS Selectivity |
|---|---|---|---|---|
| 6 | 7 | 800 | 460 | 1.7/1 |
| 7 | 2.1 | 2800 | 110 | 25/1 |

Examining Table 2 reveals that it is necessary to have an acid polishing composition in order to obtain a good tungsten polishing speed as well as a good selectivity.

EXAMPLE 3

Effect of Particles Concentration

A layer of TEOS and tungsten was polished under the same conditions as before using abrasive compositions comprising an acid aqueous suspension of individualized colloidal silica particles, not linked to each other by siloxane bonds. The abrasive compositions, of pH 2.1, contain colloidal silica particles with a mean particle diameter of 12 nm and contain 3.9% of $KIO_3$. The results obtained are shown in Table 3.

TABLE 3

| Tests | Concentration by weight of colloidal silica | Tungsten polishing speed (Å/min) | TEOS polishing speed (Å/min) | Tungsten/TEOS Selectivity |
|---|---|---|---|---|
| 8 | 15% | 3500 | 2000 | 1.7/1 |
| 9 | 2.7% | 3300 | 250 | 13/1 |

The results in Table 3 indicate that it is preferable to use a dilute acid aqueous suspension of colloidal silica in order to obtain a high tungsten polishing speed and good tungsten/TEOS selectivity.

The invention claimed is:

1. A chemical-mechanical polishing process for substrates used in the microelectronics semiconductors industry comprising at least one metal layer and one insulator layer, optionally separated by a barrier layer, in which the metal layer or layers and the barrier layer or layers are subjected to friction using a polishing pad by moving the substrate with respect to the pad and by pressing the substrate against said pad, and an abrasive composition is deposited on the pad during the polishing, wherein said process is carried out in a single stage, said abrasive composition comprising:

an acid aqueous suspension of individualized particles of colloidal silica, not linked to each other by siloxane bonds, having a mean particle diameter of between 5 and 20 nm, and having a concentration by weight of silica of between 1 and 10%, and an oxidizing agent, and in that the metal layer and the optional barrier layer, is or are eliminated from the surface of the insulator in order to obtain a metal and insulator surface not requiring any finishing polishing.

2. A chemical-mechanical polishing process according to claim 1, wherein the metal layer is produced from a metal selected from the group consisting of aluminum, copper and tungsten, and that the barrier layer is produced from a material selected from the group consisting of titanium, tantalum, titanium nitride, tantalum nitride and any combination or alloy of at least two of them.

3. A chemical-mechanical polishing process according to claim 1 wherein the insulator layer is selected from the group consisting of silicon oxide, tetraethoxysilane oxide, phosphosilicate glass, borophosphosilicate glass and polymers with a low dielectric constant.

4. A chemical-mechanical polishing process according to claim 1, wherein the oxidizing agent is an iodate.

5. A chemical-mechanical polishing process according to claim 1, wherein the mean diameter of the individualized particles of colloidal silica, not linked to each other by siloxane bonds, is between 7 and 15 nm.

6. A chemical-mechanical polishing process according to claim 1, wherein the acid aqueous suspension of colloidal silica is used at a pH of between 1 and 5.

7. A chemical-mechanical polishing process according to claim 4, wherein the iodate is selected from the group consisting of potassium iodate and sodium iodate.

8. A chemical-mechanical polishing process according to claim 1, wherein the oxidizing agent is used at a concentration by weight of between 0.1 and 15%.

9. A chemical-mechanical polishing process according to claim 8, wherein the oxidizing agent is used at a concentration by weight of between 2 and 5%.

10. A chemical-mechanical polishing process according to claim 5, wherein the mean diameter of the individualized particles of colloidal silica, not linked to each other by siloxane bonds, is between 9 and 12 nm.

11. A chemical-mechanical polishing process according to claim 1, wherein the acid aqueous suspension of colloidal silica is used at a concentration by weight of silica of between 2 and 5%.

12. A chemical-mechanical polishing process according to claim 6, wherein the acid aqueous suspension of colloidal silica is used at a pH of between 1.5 and 3.

13. An abrasive composition for the chemical-mechanical polishing in one stage of substrates used in the microelectronics semiconductors industry containing at least one metal layer and one insulator layer, wherein said abrasive composition comprises:

an acid aqueous suspension of individualized particles of colloidal silica, not linked to each other by siloxane bonds, having a mean particle diameter of between 5 and 20 nm, and having a concentration by weight of silica of between 1 and 10%, and an oxidizing agent, and the abrasive composition is substantially free of anti-corrosion agent (<0.05% by weight).

14. A composition according to claim 13, wherein the oxidizing agent is an iodate.

15. A composition according to claim 13, wherein the mean diameter of the individualized particles of colloidal silica, not linked to each other by siloxane bonds, is between 7 and 15 nm.

16. A composition according to claim 13, wherein the acid aqueous suspension of colloidal silica has a concentration by weight of silica of between 2 and 5%.

17. A composition according to claim 14 wherein the iodate is selected from the group consisting of potassium iodate and sodium iodate.

18. A composition according to claim 13 wherein the oxidizing agent is used at a concentration by weight of between 0.1 and 15%.

19. A composition according to claim 18, wherein the oxidizing agent is used at a concentration by weight of between 2 and 5%.

20. A composition according to claim 15, wherein the mean diameter of the individualized particles of colloidal silica, not linked to each other by siloxane bonds, is between 9 and 12 nm.

21. A composition according to claim 13 wherein the acid aqueous suspension of colloidal silica has a pH of between 1 and 5.

22. A composition according to claim 21 wherein the acid aqueous suspension of colloidal silica has a pH of between 1.5 and 3.

* * * * *